United States Patent
Tihanyi

(10) Patent No.: US 6,803,629 B2
(45) Date of Patent: Oct. 12, 2004

(54) VERTICAL FIELD-EFFECT TRANSISTOR WITH COMPENSATION ZONES AND TERMINALS AT ONE SIDE OF A SEMICONDUCTOR BODY

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 328 days.

(21) Appl. No.: 10/033,122

(22) Filed: Oct. 22, 2001

(65) Prior Publication Data
US 2002/0063281 A1 May 30, 2002

(30) Foreign Application Priority Data
Oct. 20, 2000 (DE) .......................... 100 52 004

(51) Int. Cl.[7] .................. H01L 29/76; H01L 29/94
(52) U.S. Cl. ............... 257/342; 257/242; 257/263; 257/328; 257/329; 257/409
(58) Field of Search .................. 257/328, 329, 257/342, 409, 242, 263

(56) References Cited

U.S. PATENT DOCUMENTS 5,455,442 A * 10/1995 Neilson et al. ............. 257/124
6,479,876 B1 * 11/2002 Deboy et al. ............... 257/401
6,512,268 B1 * 1/2003 Ueno ......................... 257/341
6,639,272 B2 * 10/2003 Ahlers et al. ............... 257/328

FOREIGN PATENT DOCUMENTS

JP      2002124675 A * 4/2002    ......... H01L/29/78

* cited by examiner

Primary Examiner—Tom Thomas
Assistant Examiner—Matthew E. Warren
(74) Attorney, Agent, or Firm—Laurence A. Greenberg; Werner H. Stemer; Gregory L. Mayback

(57) ABSTRACT

A controllable field-effect semiconductor component has a semiconductor body including a first surface, a first layer of a first conduction type, and a second layer of the first conduction type lying above the first layer. The semiconductor component also has a first terminal zone that can be contact-connected at the first surface of the semiconductor body. The first terminal zone is formed in the second layer. A channel zone of a second conduction type surrounds the first terminal zone. Compensation zones of the second conduction type that are formed in the second layer are provided. Additionally, the semiconductor component has a second terminal zone of the first conduction type that can be contact-connected at the first surface of the semiconductor body. The second terminal zone is formed in the second layer.

10 Claims, 3 Drawing Sheets

VERTICAL FIELD-EFFECT TRANSISTOR WITH COMPENSATION ZONES AND TERMINALS AT ONE SIDE OF A SEMICONDUCTOR BODY

BACKGROUND OF THE INVENTION

Field of the Invention

The present invention relates to a field-effect controllable semiconductor component having a low on resistance, high current-carrying strength and a high breakdown voltage, in which a first and a second load terminal can be contact-connected at one side of the semiconductor body.

Published German Patent Application DE 196 04 043 A1 discloses a vertical MOSFET which has a heavily n-doped substrate with a more weakly n-doped epitaxial layer lying above it. P-doped channel zones are introduced into the epitaxial layer, and heavily n-doped source zones are embedded, in turn, in the channel zones. These source zones can be contact-connected at the surface of the semiconductor body. Gate electrodes make it possible to form a conductive channel in the channel zone between the source zone and a drift zone which is formed in the epitaxial layer between the channel zone and the substrate. Furthermore, p-doped first compensation zones and n-doped second compensation zones are formed in the epitaxial layer, resulting first in low on resistance of the MOSFET when the gate electrode is driven, and in a high reverse voltage, or breakdown voltage, when the gate electrode is not driven. When the gate electrode is driven, the n-doped regions in the epitaxial layer enable charge to be transferred between the source zone and the heavily n-doped substrate which forms the drain zone. When the gate electrode is not driven and a drain-source voltage is applied, a space charge zone forms proceeding from the source zone, or the channel zone, and has the effect that free charge carriers of the first and second compensation zones recombine with one another, whereby the number of free charge carriers in the epitaxial layer is considerably reduced, and this results in a high breakdown voltage.

In the known vertical MOSFET, the substrate forms the drain zone which can be contact-connected from the rear side of the semiconductor body, that is to say the side opposite to the side of the source terminal.

Such an arrangement of the source terminal and drain terminal at opposite sides of the semiconductor body is disadvantageous for those applications in which a further chip is applied to the front side of the semiconductor body, or of a chip, in which the MOSFET is accommodated, especially when the terminals of which further chip have to be connected to the source terminal and the drain terminal of the MOSFET. By way of example, a diode may be realized in the second chip, which diode, in specific applications, is connected between the source terminal and the drain terminal of a MOSFET.

SUMMARY OF THE INVENTION

It is accordingly an object of the invention to provide a field-effect controllable semiconductor component which overcomes the above-mentioned disadvantages of the prior art apparatus of this general type. In particular, it is an object of the invention to provide a field-effect controllable semiconductor component having a low on resistance, high current-carrying strength and a high breakdown voltage, in which a first and a second load terminal can be contact-connected at one side of the semiconductor body.

With the foregoing and other objects in view there is provided, in accordance with the invention, a field-effect controllable semiconductor component that has a semiconductor body having a first layer of a first conduction type, and lying above the layer, a second layer of the first conduction type. The first layer preferably is doped more heavily than the second layer. At least one first terminal zone is formed in the second layer, which terminal zone can be contact-connected at a first surface of the semiconductor body. The at least one first terminal zone is surrounded within the second layer by a channel zone of a second conduction type.

Furthermore, compensation zones of the second conduction type are formed in the second layer. According to the invention, a second terminal zone of the first conduction type is formed in the second layer, which terminal zone can be contact-connected at the first surface of the semiconductor body. The second terminal zone is formed such that it is spaced apart from the at least one first terminal zone in the lateral direction of the semiconductor body.

In the case of a MOS transistor, the first terminal zone forms the source zone of the transistor, the second terminal zone forms the drain zone of the transistor and a control electrode which is arranged adjacent to the channel zone and is insulated from the semiconductor body forms the gate electrode of the transistor.

The second terminal zone is preferably connected to the first layer by means of a connecting zone which is a good electrical conductor and extends in the vertical direction in or along the second layer. This first layer is preferably doped more heavily than the second layer, and thus conducts better. When a drive potential is applied to the control electrode and a voltage is applied between the first and second terminal zones, a charge current occurs in the semiconductor component, which charge current, in a drift zone formed between the channel zone and the first layer, having emerged from the channel zone, runs in the vertical direction of the semiconductor body to the heavily doped first layer, from where the charge carriers pass via the connecting zone to the second terminal zone.

When the control electrode is not driven and a voltage is applied between the first and second terminal zones, a space charge zone propagates in the semiconductor body proceeding from the channel zone. If this space charge zone encompasses one of the compensation zones, then free charge carriers of this compensation zone recombine with free charge carriers from the regions of the second layer which surround the respective compensation zone. As the reverse voltage increases, or the space charge zone propagates to an increasing extent, charge carriers are thus depleted in the second layer, resulting in a high breakdown voltage. The number of charge carriers of the first conduction type in the second layer preferably corresponds to the number of charge carriers of the second type in the compensation zones, so that the second layer and the compensation zones can mutually completely deplete one another, i.e. there are no longer any free charge carriers in the second layer at the maximum possible reverse voltage.

In accordance with an added feature of the invention, the connecting zone is formed as a heavily doped zone of the first conduction type which extends, in the vertical direction of the semiconductor body, from the second terminal zone that is arranged in the region of the first surface as far as the first layer. In this case, the second terminal zone is preferably formed in the edge region of the semiconductor body.

In accordance with a concomitant feature of the invention, the first layer and the second terminal zone are connected by means of a layer which is a good electrical conductor and is formed on a, preferably inclined, side area of the semiconductor body.

Other features which are considered as characteristic for the invention are set forth in the appended claims.

Although the invention is illustrated and described herein as embodied in a vertical field-effect transistor with compensation zones and terminals at one side of a semiconductor body, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the figures, unless specified otherwise, identical reference symbols designate identical parts and regions with the same meaning. The present invention is explained below, without restricting the generality, with reference to an n-conducting MOSFET in which a source zone represents a first terminal zone, a drain zone represents a second terminal zone and a gate electrode represents a control electrode.

Figure 1:
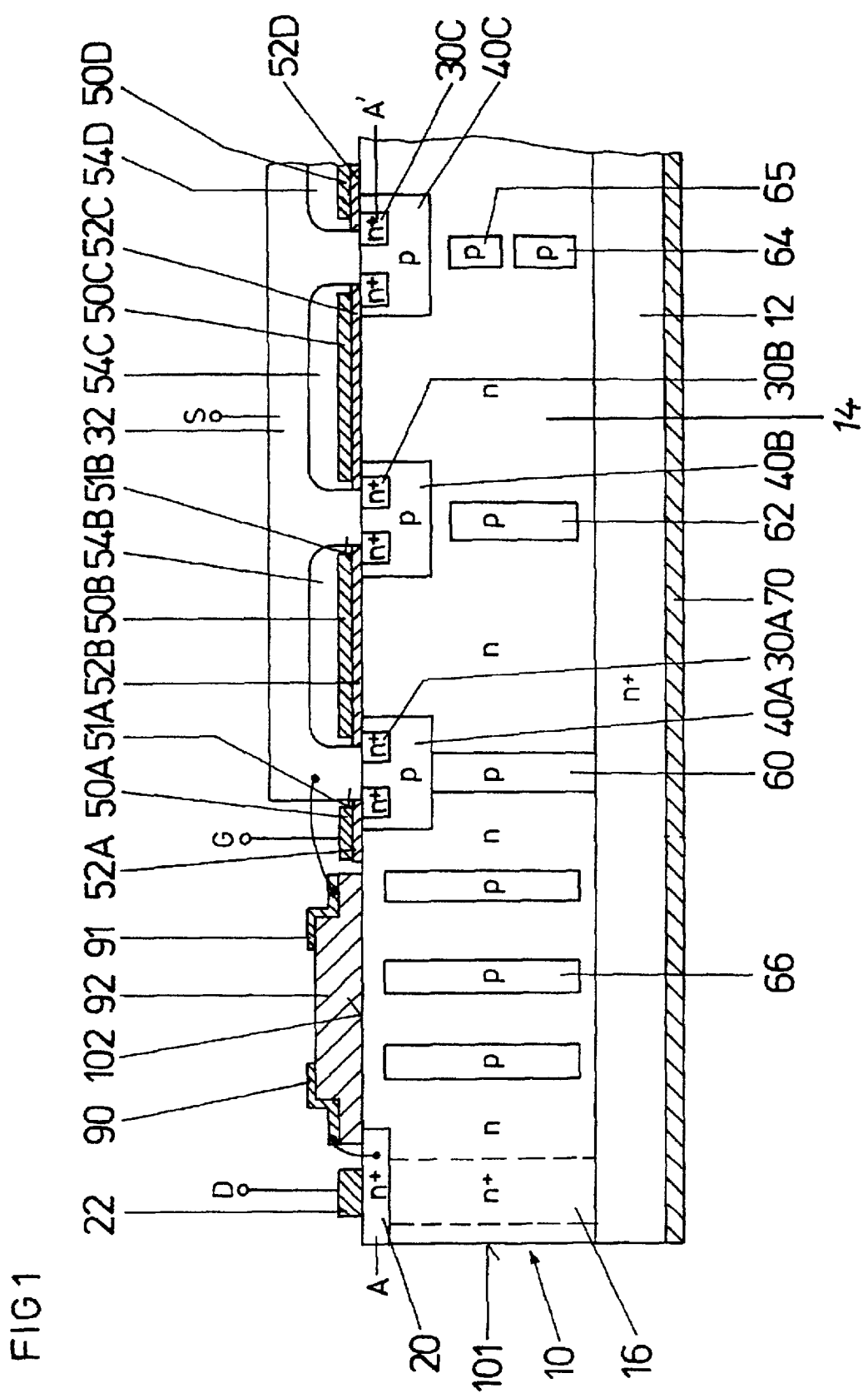
FIG. 1 shows a cross section of a first embodiment of a semiconductor component.
Figure 2:
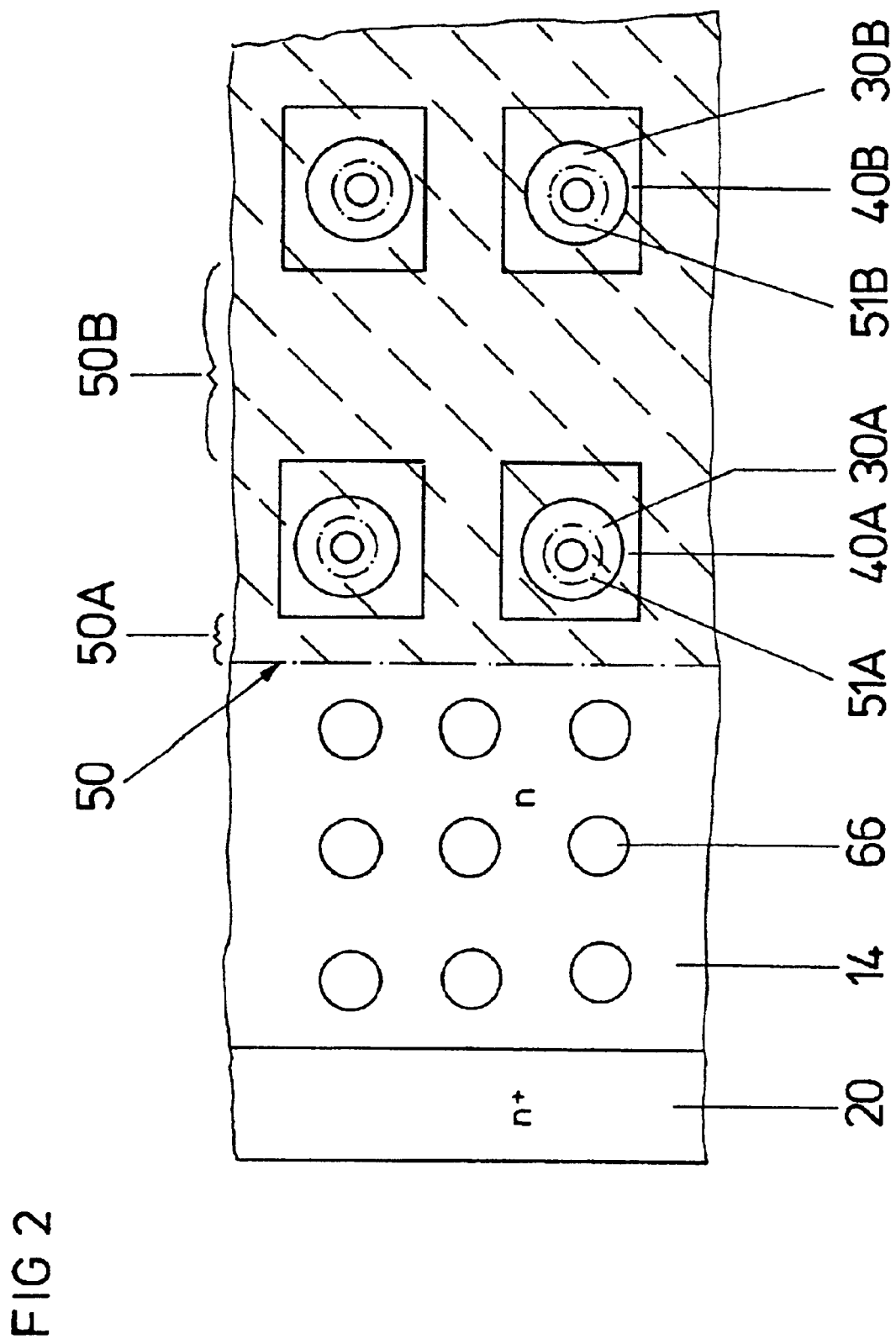
FIG. 2 shows a partial illustration of a cross section taken through the sectional plane A–A' depicted in FIG. 1.

Referring now to the figures of the drawing in detail and first, particularly, to FIG. 1 thereof, there is shown a first exemplary embodiment of a MOSFET in a side view in cross section. FIG. 2 illustrates a section taken through the semiconductor component along the sectional plane A–A' depicted in FIG. 1.

The MOSFET shown in FIG. 1 has a semiconductor body 10 having a heavily n-doped substrate 12 and a more weakly n-doped epitaxial layer 14 arranged on the substrate. In the exemplary embodiment, a plurality of p-doped channel zones 40A, 40B, 40C are formed in the epitaxial layer 14, which channel zones are formed like wells and, in the exemplary embodiment, two source zones 30A, 30B, 30C are embedded in each of the channel zones. The source zones 30A, 30B, 30C are jointly contact-connected by means of a source electrode 32 at a surface 102 of the semiconductor body. The source electrode 32 short-circuits the source zones 30A, 30B, 30C and the channel zones 40A, 40B, 40C which respectively surround the source zones 30A, 30B, 30C. The source zones 30A, 30B, 30C are of annular design in the exemplary embodiment, as can be seen in particular from the plan view in FIG. 2.

A gate electrode 50 is applied, in a manner insulated from the semiconductor body 10, on the first surface 102 of the semiconductor body 10, which extends in the lateral direction of the semiconductor body 10 from each of the source zones 30A, 30B, 30C along the channel zone 40A, 40B, 40C as far as the n-doped region of the second or epitaxial layer 14. The n-doped region of the second or epitaxial layer 14 between the channel zone and the substrate 12 forms the so-called drift zone or drift path of the MOSFET.

FIG. 1 shows respective sections 50A, 50B, 50C, 50D of the gate electrode 50, which is illustrated by broken lines with dash-dotted contours in FIG. 2, in order to illustrate the position of the gate electrode 50 above the channel zones 40A, 40B and the source zones 30A, 30B. The gate electrode 50 is designed in plate form and has respective annular cutouts 51A, 51B above the source zones 30A, 30B, 30C and above the channel zones 40A, 40B, 40C, through which cutouts the source electrode 32 extends. The gate electrode 50 is insulated from the source electrode by means of insulation layers 54B, 54C, 54D. The insulation layer 52A, 52B, 52C, 52D between the gate electrode 50 and the semiconductor body 10 and the insulation layers 54B, 54C, 54D between the gate electrode and the source electrode 32 are preferably composed of a semiconductor oxide such as e.g. silicon oxide.

The provision of a large number of source zones 30A, 30B, 30D which are each part of a so-called cell of the MOSFET enables the MOSFET to have a large current-carrying strength, where the current-carrying strength can be set through the number of cells.

The MOSET shown in FIG. 1 has a drain zone 20 spaced apart from the source zones 30A, 30B, 30C in the lateral direction of the semiconductor body 10. This drain zone is formed like a well in the epitaxial layer 14 and is contact-connected by means of a drain electrode 22 on the first surface 102 of the conductor body 10.

In the drift zone, that is to say in the region of the epitaxial layer 14 between the channel zones 40A, 40B, 40C and the substrate 12, p-doped compensation zones 60, 62, 64, 65, 66 are formed which, in the exemplary embodiment, are designed in pillar form and, in their longitudinal direction, extend in the vertical direction of the semiconductor body 10. The compensation zones 60, 62, 64, 65 that are arranged between respective ones of the channel zones 40A, 40B, 40C and the substrate 12 can be like the compensation zone 60 which adjoins the channel zone 40A or can be separated from the channel zone 40B, 40C by part of the epitaxial layer 14, like e.g. the compensation zones 62, 64, 65. Moreover, a plurality of compensation zones 64, 65 may be arranged one below the other in the vertical direction of the semiconductor body 10.

The drain zone 20 and source zones 30A, 30B, 30C are arranged spaced apart from one another in the lateral direction of the semiconductor body 10. Compensation zones 66 likewise are formed in the epitaxial layer 14 between the channel zone 40A and the drain zone 20, which compensation zones run like pillars in the vertical direction of the semiconductor body 10.

In order to connect the drain zone 20 to the substrate 12, a connecting zone 16 is provided which extends in the vertical direction of the semiconductor body 10 from the drain zone 20 as far as the substrate 12. This connecting zone 16 is preferably doped more heavily than the remaining regions of the epitaxial layer 14, and the doping of the connecting zone 16 may correspond to the doping of the substrate 12.

If, in the MOSFET illustrated in FIG. 1, a positive voltage is applied between the gate electrode 50 and the source zones 30A, 30B, 30C, then conductive channels form in the channel zones 40A, 40B, 40C, which channels run below the gate electrode 50. When a voltage is applied between the drain electrode 22 and the source electrode 32, n-type charge carriers pass from the source zones 30A, 30B, 30C into the drift zone. These charge carriers move in the epitaxial layer 14 essentially in the vertical direction of the semiconductor body 10 into the heavily doped substrate 12, from where they pass via the connecting zone 16 to the drain zone 20. The drain zone, which is provided with the reference symbol 20 in FIG. 1, the connecting zone 16 and the substrate 12 together form the drain zone of the MOSFET according to the invention. In order to connect the zone 20 to the substrate 12 in a manner exhibiting the least possible resistance, no p-doped compensation zones 66 are provided between the zone 20 and the substrate 12.

If the gate electrode is not driven in the MOSFET shown in FIG. 1, and if a voltage is applied between the drain electrode 22 and the source electrode 32, then free charge carriers of the compensation zones 60, 62, 64, 65, 66 start to recombine with free charge carriers of the epitaxial layer 14, as a result of which, as the reverse voltage increases, free charge carriers are depleted in the epitaxial layer 14, as explained with reference to the various compensation zone 60, 62, 64, 65.

The compensation zone 60 is connected via the channel zone 40a to the source potential, which is usually a fixed reference potential, in particular ground. If the potential rises in the substrate 12, or in the region of the epitaxial layer 14 which surrounds the compensation zone 60, when the drain potential increases, then a space charge zone containing many free charge carriers propagates in a manner proceeding from the compensation zone 60 in the lateral direction of the semiconductor body 10.

The compensation zone 62 is arranged in a floating manner, i.e. not connected to a fixed potential, in the epitaxial layer 14. If a space charge zone propagates in a manner proceeding from the channel zone 40b when a reverse voltage is applied, then the compensation zone 62 assumes the value of the potential of the space charge zone in the region of the compensation zone 62. If the space charge zone of the channel zone 40b reaches the compensation zone 62, then a space charge zone no longer containing free charge carriers propagates in a manner proceeding from the compensation zone 62 in the lateral direction. The same applies correspondingly to the compensation zones 64 and 65, a space charge zone forming in a manner proceeding from the lower compensation zone 64 only when the latter is encompassed by the space charge zone of the upper compensation zone 65.

The maximum reverse voltage of the MOSFET is reached when the space charge zones proceeding from the individual compensation zones 60, 62, 64, 65 have encompassed the entire epitaxial layer 14. The doping of the epitaxial layer 14 and of the compensation zones 60, 62, 64, 65, 66 is preferably coordinated with one another in such a way that the number of n-type charge carriers in the epitaxial layer 14 corresponds to the number of p-type charge carriers in the compensation zones 60, 62, 64, 65, 66, with the result that there are no free charge carriers when the space charge zone has encompassed the entire epitaxial layer 14.

The compensation zones 66, which are arranged in a floating manner in the epitaxial layer 14 between the source zone 30a and the drain zone 20, prevent a breakdown of the MOSFET in the lateral direction of the semiconductor body 10 in the epitaxial layer 14. In the MOSFET, the compensation zones 66 are successively encompassed by a space charge zone which proceeds from the channel zone 40a.

FIG. 1 furthermore shows field plates 90, 91, which are formed above the semiconductor body 10 in a manner isolated from the latter by an insulation layer 92. One of the field plates 90 is connected to the drain zone 20 and one of the field plates 91 is connected to the source electrode 32. The field plates 90, 91 influence the field strength profile in the semiconductor body 10, and as is known, prevent a premature voltage breakdown.

In the MOSFET shown in FIG. 1, the drain zone 20 is formed at the edge of the semiconductor body 10. The side area 101 terminates the semiconductor body 10 in the lateral direction. The area 101 is usually the area produced when the semiconductor body 10 is sawn from a wafer having a multiplicity of semiconductor bodies.

Figure 3:
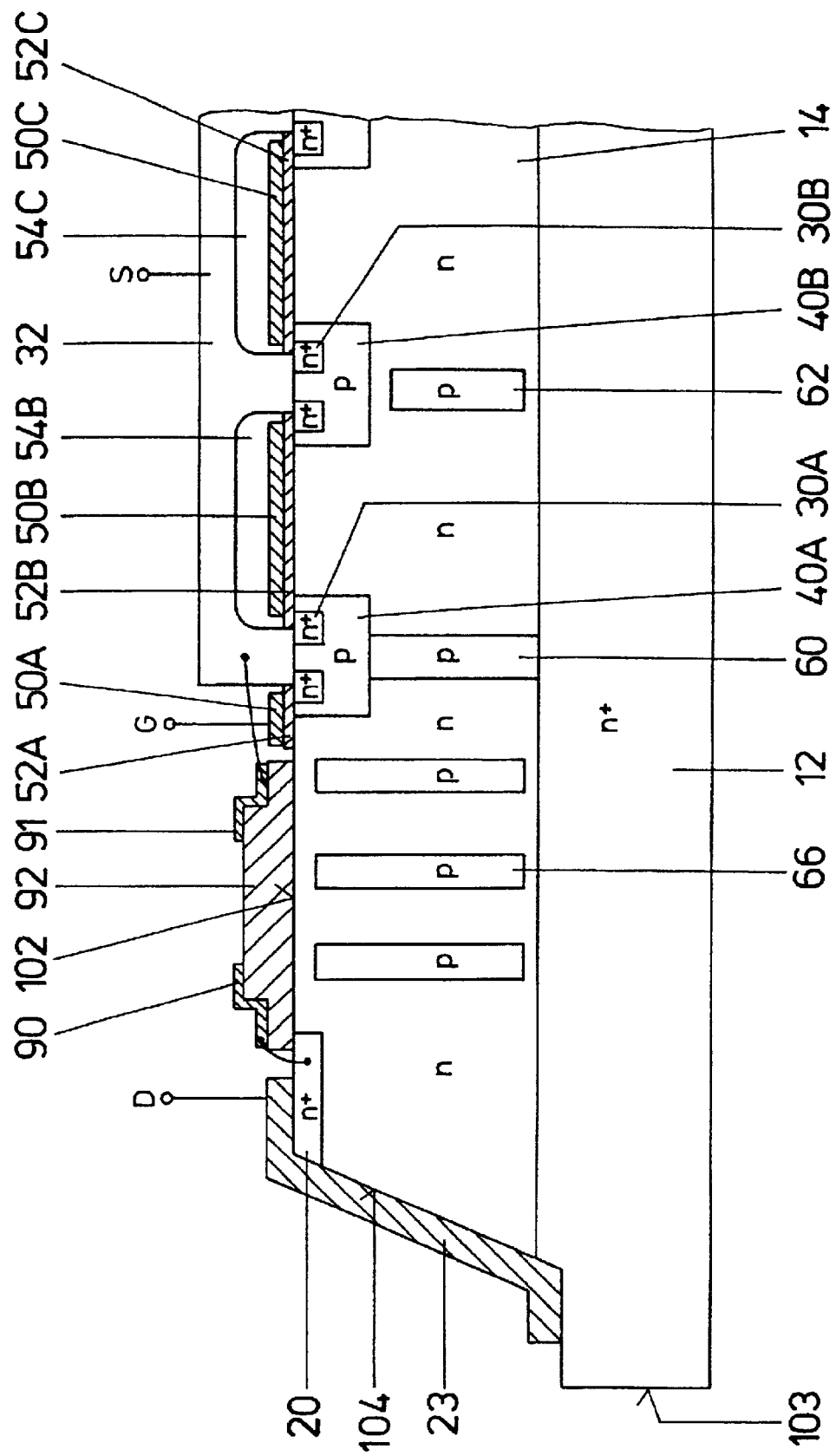
FIG. 3 shows a cross section of a second embodiment of a semiconductor component.

FIG. 3 shows a further exemplary embodiment of a MOSFET, which differs from that illustrated in FIG. 1 by virtue of the fact that the drain zone 22 and the substrate 12 are connected to one another by a layer 23, in particular a metallization layer, which is a good electrical conductor and is applied on a side area 104 of the semiconductor body 10. The side area in FIG. 3 is slightly inclined, proceeding from the substrate 12 in the direction of the drain zone 20. The substrate 12 extends below the area 104 in the lateral direction as far as a side area 103, which forms the lateral boundary of the semiconductor body 10 and which results for example from the semiconductor body 10 being sawn from a wafer. The area 104 is thus set back relative to the terminating area 103. The metallization layer 23 simultaneously forms the drain electrode of the MOSFET.

The application of a metallization layer 70 to the substrate, as is provided in the MOSFET in accordance with FIG. 1, is dispensed with in the MOSFET in accordance with FIG. 3.

I claim:

1. A field-effect controllable semiconductor component, comprising:
   a semiconductor body including a first surface, a first layer of a first conductivity type, and a second layer of the first conductivity type lying above said first layer;
   a first terminal zone that can be contact-connected at said first surface of said semiconductor body, said first terminal zone formed in said second layer;
   a channel zone of a second conductivity type that surrounds said first terminal zone;
   compensation zones of the second conductivity type, said compensation zones formed in said second layer;
   a second terminal zone of the first conductivity type that can be contact-connected at said first surface of said semiconductor body, said second terminal zone formed in the second layer; and
   a connecting zone located between said second terminal zone and said first layer, said connecting zone being doped more heavily than remaining regions of said second layer.

2. The semiconductor component according to claim 1, wherein:
   none of said compensation zones are formed in said connecting zone.

3. The semiconductor component according to claim 2, wherein said first layer has a doping and said connecting zone has a doping that essentially corresponds to said doping of said first layer.

4. The semiconductor component according to claim 1, wherein said first layer is doped more heavily than said second layer.

5. The semiconductor component according to claim 1, wherein said semiconductor body has an edge, and said second terminal zone is formed at said edge of said semiconductor body.

6. The semiconductor component according to claim 1, comprising:

an electrically conductive layer connecting said first layer and said second terminal zone;

said semiconductor body having a side area to which said electrically conductive layer is applied.

7. The semiconductor component according to claim 1, wherein at least some of said compensation zones adjoin said channel zone.

8. The semiconductor component according to claim 1, wherein said compensation zones are designed in pillar form and extend vertically in said second layer.

9. The semiconductor component according to claim 1, wherein said second layer includes a number of charge carriers of the first conductivity type and a number of charge carriers of the second conductivity type that are approximately of the same magnitude.

10. The semiconductor component according to claim 1, comprising a control electrode configured adjacent said channel zone, said control electrode being insulated from said semiconductor body.

* * * * *